United States Patent
Bartzsch et al.

(10) Patent No.: US 9,994,950 B2
(45) Date of Patent: Jun. 12, 2018

(54) METHOD FOR DEPOSITING A PIEZOELECTRIC FILM CONTAINING AlN, AND A PIEZOELECTRIC FILM CONTAINING AlN

(71) Applicants: Fraunhofer-Gesellschaft zur Förderung der angewandten Forschung e.V., Munich (DE); TU Dresden, Dresden (DE)

(72) Inventors: Hagen Bartzsch, Dresden (DE); Daniel Glöß, Dresden (DE); Peter Frach, Radeberg (DE); Stephan Barth, Dresden (DE)

(73) Assignees: FRAUNHOFER-GESELLSCHAFT ZUR FÖRDERUNG DER ANGEWANDTEN FORSCHUNG E.V., Munich (DE); TU DRESDEN, Dresden (DE)

(*) Notice: Subject to any disclaimer, the term of this patent is extended or adjusted under 35 U.S.C. 154(b) by 224 days.

(21) Appl. No.: 14/901,817
(22) PCT Filed: Jun. 24, 2014
(86) PCT No.: PCT/EP2014/063225
§ 371 (c)(1),
(2) Date: Dec. 29, 2015
(87) PCT Pub. No.: WO2015/007466
PCT Pub. Date: Jan. 22, 2015

(65) Prior Publication Data
US 2016/0369390 A1    Dec. 22, 2016

(30) Foreign Application Priority Data
Jul. 16, 2013    (DE) .................. 10 2013 213 935

(51) Int. Cl.
*C23C 14/35*    (2006.01)
*C23C 14/06*    (2006.01)
(Continued)

(52) U.S. Cl.
CPC ...... *C23C 14/0641* (2013.01); *C23C 14/0036* (2013.01); *C23C 14/0094* (2013.01);
(Continued)

(58) Field of Classification Search
CPC ............ C23C 14/0036; C23C 14/0094; C23C 14/0641; C23C 14/3414; C23C 14/3464;
(Continued)

(56) References Cited

U.S. PATENT DOCUMENTS

| 2009/0246385 A1 | 10/2009 | Felmetsger et al. |
| 2013/0049545 A1 | 2/2013 | Zou et al. |
| 2013/0127300 A1 | 5/2013 | Umeda et al. |

FOREIGN PATENT DOCUMENTS

| DE | 10 2004 046 390 A1 | 4/2006 |
| WO | WO 2006/034739 A2 | 4/2006 |

OTHER PUBLICATIONS

Felmetsger, V.V., et al., "Deposition of ultrathin AlN films for high frequency electroacoustic devices," J. Vac. Sci. Technol. A 29(2), dated Mar./Apr. 2011, pp. 1-8, © 2011 American Vacuum Society.
(Continued)

*Primary Examiner* — Rodney G McDonald
(74) *Attorney, Agent, or Firm* — Brinks Gilson & Lione

(57) ABSTRACT

A method for depositing a piezoelectric film may be provided containing AlN on a substrate by means of magnetron sputtering of at least two targets—of which at least one target contains aluminum—within a vacuum chamber, into which a mixture of gases containing at least reactive nitrogen gas and an inert gas is introduced, and during which magnetron sputtering the unipolar pulse mode and the bipolar pulse mode are alternately used. A film may be provided containing AlN of formula $Al_xN_yO_z$, where $(0.1 \leq X \leq 1.2)$; $(0.1 \leq Y \leq 1.2)$ and $(0.001 \leq Z \leq 0.1)$.

10 Claims, 1 Drawing Sheet

(51) Int. Cl.
    *C23C 14/00*     (2006.01)
    *C23C 14/34*     (2006.01)
    *C30B 29/40*     (2006.01)
    *H01L 41/316*     (2013.01)
    *H01L 41/187*     (2006.01)
    *C30B 23/02*     (2006.01)

(52) U.S. Cl.
    CPC ...... *C23C 14/3414* (2013.01); *C23C 14/3464* (2013.01); *C23C 14/3485* (2013.01); *C23C 14/35* (2013.01); *C23C 14/352* (2013.01); *C30B 23/02* (2013.01); *C30B 29/403* (2013.01); *H01L 41/187* (2013.01); *H01L 41/316* (2013.01)

(58) Field of Classification Search
    CPC ... C23C 14/3485; C23C 14/35; C23C 14/352; C30B 23/02; C30B 29/403; H01L 41/187; H01L 41/316
    USPC .................................................... 204/192.18
    See application file for complete search history.

(56) References Cited

OTHER PUBLICATIONS

Zhang, J.X., et al., "Interface study of AlN grown on Si substrates by radio-frequency magnetron reactive sputtering," dated Aug. 12, 2004, pp. 1-6, Available online at ScienceDirect, Thin Solid Films 471 (2005) 336-341, © 2004 Elsevier B.V.

Wang, C., et al., "Microstructural evolution of AlN coatings synthesized by unbalanced magnetron sputtering," dated Jun. 7, 2005, pp. 621-627, J. Vac. Sci. Technol. Part A vol. 23, No. 4, American Vacuum Society, Melville, NY XP012074062, © 2005 American Vacuum Society.

Walter, S., et al., "Smart ultrasonic sensors systems: potential of aluminum nitride thin films for the excitation of the ultrasound at high frequencies," dated Apr. 1, 2012, pp. 1193-1199, Microsystem Technologies, vol. 18, No. 7-8, XP055136305, © 2012 Springer-Verlag.

Akiyama, M., et al., "Influence of oxygen concentration in sputtering gas on piezoelectric response of aluminum nitride thin films," dated Jul. 14, 2008, pp. 21903-1 to 21903-3, Applied Physics Letters, American Institute of Physics, vol. 93, No. 2, XP012112414, © 2008 American Institute of Physics, US.

Zukauskaite, A., et al., "Microstructure and dielectric properties of piezoelectric magnetron sputtered w-$Sc_xAl_{1-x}N$ thin films," dated May 1, 2012, pp. 93527-1 to 93527-3, Journal of Applied Physics, American Institute of Physics, vol. 111, No. 9, XP012159657, © 2012 American Institute of Physics, US.

Deng, R., et al., "Bandgap in $Al_{1-x}Sc_xN$," dated Mar. 18, 2013, pp. 112103-1 to 112103-5, Applied Physics Letters, American Institute of Physics, vol. 102, No. 11, XP012171541, © 2013 American Institute of Physics, US.

Höglund, C., et al., "Cubic $Sc_{1-x}Al_xN$ solid solution thin films deposited by reactive magnetron sputter epitaxy onto ScN(111)," dated Jun. 5, 2009, pp. 113517-1 to 113517-7, Journal of Applied Physics, American Institute of Physics, vol. 105, No. 11, XP012125499, © American Institute of Physics, US.

International Search Report with English translation, pp. 1-4, dated Aug. 29, 2014, issued in International Application No. PCT/EP2014/063225, European Patent Office, Rijswijk, The Netherlands.

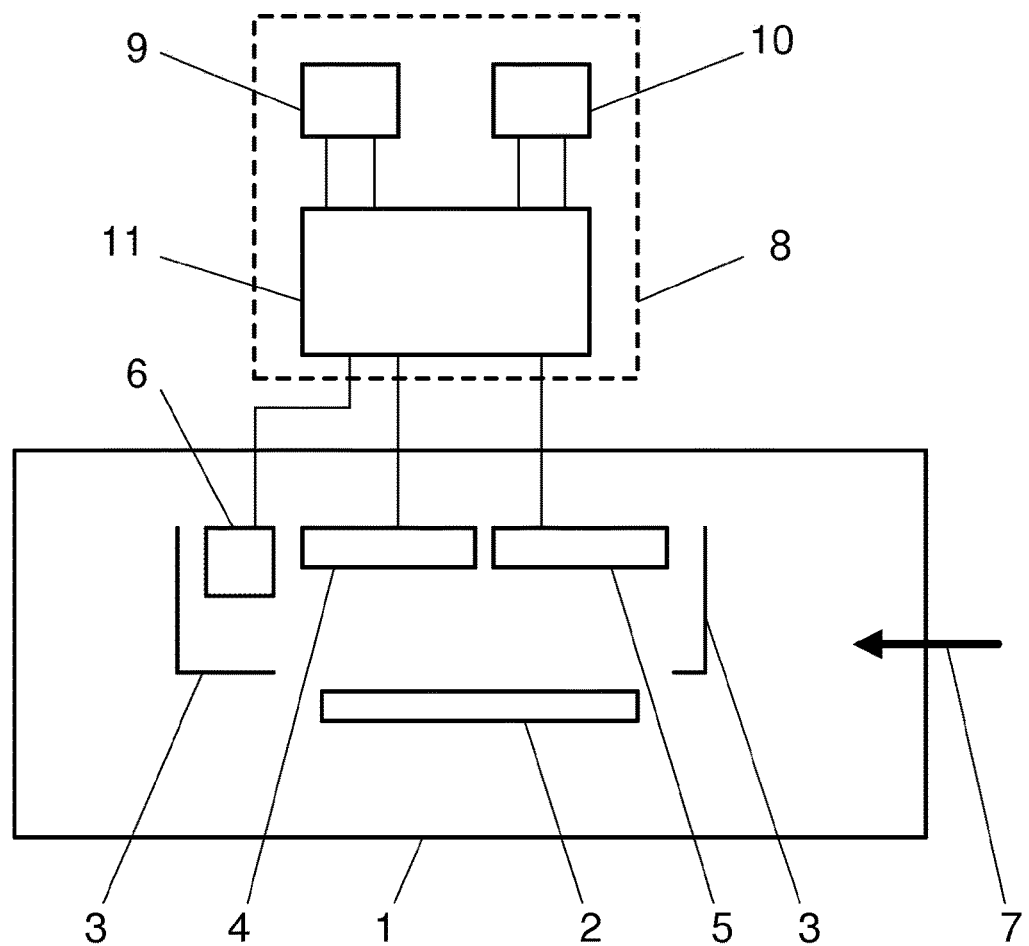

METHOD FOR DEPOSITING A PIEZOELECTRIC FILM CONTAINING AlN, AND A PIEZOELECTRIC FILM CONTAINING AlN

CROSS-REFERENCE TO RELATED APPLICATIONS

This application is a 371 nationalization of PCT/EP2014/063225, entitled "Method for Depositing a Piezoelectric Film Containing AlN, and a Piezoelectric Film Containing AlN," having an international filing date of Jun. 24, 2014, the entire contents of which are hereby incorporated by reference, which in turn claims priority under 35 USC § 119 to German patent application DE 10 2013 213 935.7 filed on Jul. 16, 2013, the entire contents of which are hereby incorporated by reference.

TECHNICAL FIELD

The invention relates to a method for depositing a piezoelectric AlN film on a substrate by means of magnetron sputtering, as well as a piezoelectric film containing AlN.

BACKGROUND

Materials in which the piezoelectric effect can be applied are being increasingly used in the production of sensors. This means that these materials deform when an electric voltage is applied. An important material parameter for the piezoelectric effect is the piezoelectric charge constant d. It describes the functional relationship between the applied field strength and the expansion of a piezoelectrically active material generated therewith. Thus, the piezoelectric charge constant $d_{33}$ describes, for example, the expansion or compression of the piezoelectric material parallel to the applied electric field.

Films containing aluminum nitride (AlN) are known for their piezoelectric properties. Only a few processes with specific process parameters, which only allow a low tolerance range, are suitable, however, for the deposition of such films containing AlN in order to achieve good piezoelectric properties. A special crystal orientation of the AlN crystals, the so-called c-axis orientation, is necessary during the crystal growth of the AlN film if an AlN film with a piezoelectric charge constant $d_{33}$ that is greater than zero is to be deposited.

It is known that the piezoelectrically active films containing AlN can be deposited by means of magnetron sputtering. In [J. X. Zhang, Y. Z. Chen, H. Cheng, A. Uddin, Shu Yuan, K. Pita, T. G. Andersson, Interface Study of AlN Grown on Si Substrates by Radiofrequency Magnetron Reactive Sputtering, Thin Solid Films 471, 2005, p. 336-341] it is proposed to deposit AlN films with c-axis orientation by means of reactive RF sputtering. The disadvantage of RF sputtering is that only low deposition rates of about 10 nm/min can be achieved during the deposition of piezoelectric AlN films.

In US 2009/0246385 A1 it is shown that piezoelectric AlN films can also be deposited by means of reactive pulse magnetron sputtering (20 kHz to 200 kHz) in addition to reactive RF sputtering. Sputtering methods with a DC power supply have considerable deficits with reference to process stability due to parasitic arc discharges.

Even if possibilities for the deposition of piezoelectric AlN films have been demonstrated with the previously described methods, they are nevertheless restricted in that mechanical stress within the deposited layers that can damage the film also occurs with these methods as the thickness of the film increases. Thus, in [Valery V. Felmetsger, Pavel N. Laptev, Roger J. Graham, Deposition of Ultrathin AlN Films for High Frequency Electroacoustic Devices, J. Vac. Sci. Technol. A 29(2), Feb. 14, 2011] it is disclosed that piezoelectric AlN films can only be deposited with sufficiently low mechanical stress up to a film thickness of about 2 μm by means of pulse magnetron sputtering at 40 kHz.

BRIEF DESCRIPTION OF THE DRAWINGS

FIG. 1 shows a schematic representation of a device that is suitable for carrying out the method according to the invention.

DETAILED DESCRIPTION

The object underlying the invention, therefore, is to create a method by means of which the disadvantages of the prior art are overcome. In particular, with the method according to the invention it should be possible to deposit a piezoelectric film containing AlN with c-axis orientation and the piezoelectric charge constant $d_{33}$ at a deposition rate of more than 100 nm/min, which has a sufficiently low mechanical film stress of less than 500 mPa even above a film thickness of 2 μm. A piezoelectrically active film containing AlN should furthermore be created.

Reactive pulse magnetron sputtering is used in the method according to the invention due to the requirement for a higher deposition rate. A film containing AlN is deposited on a substrate within a vacuum chamber as at least two targets are sputtered in a gas mixture comprising at least one inert gas and nitrogen gas by means of at least one sputter magnetron. At least one of the two targets comprises the element aluminum, that is, the target either is entirely composed of aluminum or has still other components of at least one other chemical element in addition to aluminum. Argon is preferentially used as inert gas. A sufficiently stable discharge is ensured within the frequency range of 10 kHz to 300 kHz by means of a pulsed power supply in the magnetron. The power density in the method according to the invention is of at least 11 W/cm$^2$, especially if a mixed pulse mode is used in which the unipolar pulse mode has a proportion of more than 50%, but a power density of at least 18 W/cm$^2$ can also be applied. In this connection, the term power density is to be understood as the electric power inputted into the target per target surface unit. In a device with several targets or with several magnetrons, the power density is obtained by dividing the total power of all magnetrons by the total surface of all targets.

The requirement of a good piezoelectric efficiency of a deposited AlN film with simultaneously low mechanical stress within the film entails a very balanced bombardment of the growing AlN film with energy-rich particles, since an excessively strong bombardment of the substrate with the particles indeed promotes the formation of films with clear c-axis orientation and consequently high piezocoefficients, but on the other hand leads to the formation of high compressive stress within the film. According to the present invention, this technical problem is solved by utilizing a mixed pulse mode. That is, the magnetron is alternately operated in the unipolar pulse mode and in the bipolar pulse mode during the deposition of the film containing AlN. In this case, switching from one pulse mode to another and back again takes place within a time interval that is shorter than the time interval required for the deposition of a single atom layer of a film containing AlN.

The present invention will be described in more detail hereinafter with reference to exemplary embodiments. FIG. 1 shows a schematic representation of a device that is suitable for carrying out the method according to the invention. A piezoelectrically active film containing AlN is deposited on a substrate 2 in a vacuum chamber 1. The deposition process is at the same time carried out in a stationary manner, that is, without a movement of the substrate 2. For this purpose, two targets 4 and 5 comprising aluminum are sputtered by means of a magnetron sputtering device enclosed by a plasma screen 3. An electrode 6 is likewise enclosed by the plasma screen 3.

It should be noted that the deposition of a film containing AlN according to the invention can, however, also be carried out dynamically, that is, if the substrate to be coated carries out a relative movement to the magnetron sputtering device during coating.

The deposition of the film containing AlN on the substrate 2 is carried out reactively in that a gas mixture of an inert gas and the reactive gas nitrogen is introduced into the vacuum chamber 1 through an inlet 7 while the targets 4 and 5 are being sputtered. In an alternative embodiment, the inert gas and the reactive gas can also be introduced into the vacuum chamber 1 through separate inlets. Argon was used as inert gas in the exemplary embodiment. Krypton or xenon can also be used, for example, as alternative inert gases. An inert gas mixture of at least two of the previously mentioned inert gases is used in another embodiment.

The reactive deposition process is carried out by means of a process control in the so-called transition area of the reactive discharge. This means that it is ensured that the target is only partially covered with a compound layer by means of a dosed supply of reactive gas. The method steps for carrying out such a process control are known. A high sputtering and deposition rate is ensured in this way due to the high sputter yield of the metallic areas of the target.

The targets 4 and 5 are sputtered by means of pulse magnetron sputtering, wherein a power supply device 8 makes available the electrical pulses needed therefor. The power supply device 8 comprises a component 9, which generates unipolar direct voltage pulses; a component 10, which generates bipolar pulses and a component 11, which functions as a switchover device and connects through either the unipolar pulses generated by means of component 9, or the bipolar pulses generated by means of component 10 to the targets 4 and 5.

In the bipolar pulse mode, the bipolar pulses generated by component 10 are connected with alternating polarity between the target 4 and the target 5, so that the two targets 4 and 5 function as cathode or anode in an alternating manner and in the opposite direction. In the unipolar pulse mode, both targets 4 and 5 function as cathode at the same time, as the unipolar direct voltage pulses generated by the component 9 between the targets 4 and 5, on the one hand, and the electrode 6 functioning as anode, on the other hand, are connected to the magnetron discharge.

Reference should be made to the fact that the method according to the invention is not linked to the presence of exactly two targets or two sputter magnetrons. The method according to the invention can furthermore be carried out with more than two magnetrons or targets.

A constant back-and-forth switching between the unipolar and the bipolar pulse mode takes place during sputtering of the targets 4 and 5 by means of the component 11. A full cycle of back-and-forth switching is executed thereby within a time period that is shorter than the time period that is needed for the deposition of an atom layer of the deposited film. The change between the unipolar pulse mode and the bipolar pulse mode is carried out with a frequency within the range of 50 Hz to 10 kHz in the exemplary embodiment. The change from unipolar pulse mode to bipolar pulse mode and back, for example, was operated with a frequency of 1 kHz in the exemplary embodiment. The percentage of the phases in which the targets 4 and 5 are sputtered in the unipolar pulse mode and the percentage of the phases in which the targets 4 and 5 are sputtered in the bipolar pulse mode must not be identical in the method according to the invention.

As was already previously described, mechanical film stress with increasing film thickness represents a technical problem in particular during the deposition of piezoelectric films. With increasing film thickness, such films display a tendency to forming tensile stress. This can be counteracted according to the invention by changing the ratio of percentages of unipolar pulse mode and bipolar pulse mode during a stationary deposition process and/or the pressure within the vacuum chamber 1. The percentages of the unipolar pulse mode to the bipolar pulse mode can be either set to a constant value by means of the power supply device 8, or can be continuously or also erratically changed during coating during a coating procedure. The pressure inside the vacuum chamber 1 can be adjusted and modified with known regulation processes.

The experimental setup described with reference to FIG. 1 was used as follows for the deposition of a piezoelectrically active AlN film with a thickness of 50 μm: the mixed pulse mode was adjusted in such a way that the bipolar pulse mode continuously represented a proportion of 90% and the unipolar pulse mode consequently represented a proportion of 10% during coating. A power density of 12 W/cm$^2$ was furthermore adjusted. The interior of the vacuum chamber 1 showed a pressure of 0.7 Pa at the beginning of the coating procedure. After the thickness of the AlN film deposited on the substrate 2 reached 10 μm, the pressure in the vacuum chamber 1 was reduced to 0.6 Pa. The pressure in the vacuum chamber was further decreased to 0.5 Pa with a film thickness of 40 μm. In this way, it was possible to deposit a piezoelectrically active AlN film having a thickness of 50 μm with very low mechanical film stress. The reduction of the pressure in the vacuum chamber 1 with increasing film growth is thus a helpful mode of operation to reduce mechanical film stress during the deposition of films containing AlN, which could also be confirmed with the aid of other coating examples. With respect to the substrate temperature, a bandwidth of 20° C. to 600° C. was obtained with the method according to the invention.

A piezoelectrically active AlN film having a thickness of 10 μm should be deposited on a substrate 2 in a second coating procedure. The deposition process was started in the vacuum chamber at a pressure of 0.7 Pa and a mixed pulse mode, in which the unipolar pulse mode merely had a proportion of 1%. The proportion of the unipolar pulse mode was constantly increased by means of the power supply device 8 during the film deposition, until it finally represented a proportion of 80% in the mixed pulse mode with a target film thickness of 10 μm. A power density of 11.5 W/cm$^2$ in the targets 4 and 5 was fed at the beginning of the film deposition. With the increase in the proportion of the unipolar pulse mode, the power density fed into the targets 4 and 5 was continuously increased up to a final power density of 20 W/cm$^2$ upon reaching the target film thickness of 10 μm. The pressure within the vacuum chamber 1 was at the same time constantly reduced to a pressure end value of 0.2 Pa during coating. It was also possible to deposit an AlN film with good piezoelectric properties and low mechanical film stress by means of this procedure.

The mechanical stress within a film containing AlN could however also be reduced by modifying the composition of an inert gas mixture introduced into the vacuum chamber 1 while the film is being deposited. An inert gas mixture can in this way be completely composed of argon at the beginning of the film deposition, while the proportion of argon is reduced with increasing film growth and an increasing proportion of the inert gas xenon or krypton is instead introduced into the vacuum chamber 1 through the inlet 7. For the sake of completeness, it should additionally again be mentioned that each of the gases flowing into the vacuum chamber 1 can alternatively also be introduced into the vacuum chamber 1 through a separate inlet.

Piezoelectrically active AlN films with a deposition rate of more than 100 nm/min and a mechanical film stress of less than 500 mPa can be deposited with the method parameters mentioned above with regard to the method according to the invention.

For the configuration of a c-axis orientation during the deposition of a film containing AlN, it is advantageous if a considerable portion of the layer-forming particles impact as perpendicularly as possible on a substrate to be coated. The angle with respect to the normal between each point on the substrate surface to be coated and the nearest point on the pathway of a target should be ≤30° with a coating distance of ≤100 mm. The term target pathway is to be understood as those surface areas of the target in which the strongest material abrasion occurs. These areas are frequently also called "race track". It is particularly advantageous if a magnetron sputtering device with several concentric discharge rings is used in case of a stationary substrate coating of large substrates (d=100 mm or greater), that is, a coating without relative movement between the sputtering target and the substrate (an optional substrate rotation is excluded from this). In dynamic substrate coating (with relative movement between the sputtering target and the substrate), it is advantageous if the work is performed with a steam flow aperture, which ensures that the aforementioned condition with regard to the angle to the normal is met.

It is known that the piezoelectric efficiency of a film containing AlN can be improved if this film also has a portion of the element scandium admixed to it. Two targets 4 and 5, which also have the element scandium in addition to the element aluminum, are therefore sputtered in another embodiment, so that a ScAlN film is deposited on the substrate. This can be carried out in that, for example, alloy targets composed of scandium and aluminum are sputtered. Targets composed of individual tiles, of which at least one tile is composed of aluminum and at least one tile is composed of scandium, can alternatively also be sputtered. The deposition of a ScAlN film can also be carried out by means of co-sputtering in another alternative, that is, one of the targets 4 and 5 is a pure aluminum target and the other target is a pure scandium target.

Piezoelectrically active films containing AlN which have a specific electric polarity can be deposited with all of the deposition methods described above. In this connection, the polarity describes the connection between the direction of the electric field on the material and the direction of the deformation of the material. With a piezoelectric material, the polarity consequently indicates, on the one hand, in which direction the material is deformed, if an electric voltage with predetermined electric polarity is applied on the material, and, on the other hand, which electric polarity is configured in the piezoelectric material, if a mechanical deformation is implemented with the piezoelectric material in a specific direction.

It could be surprisingly determined that the electric polarity of a piezoelectrically active film containing AlN can be inverted, if the latter also additionally has a low amount of the element oxygen. A piezoelectrically active film containing AlN according to the invention having the piezoelectric charge constant $d_{33}$ is thus characterized in that the film additionally also has the element oxygen, in such a way that the film containing AlN corresponds to the formula $Al_XN_YO_Z$, wherein $(0.1 \leq X \leq 1.2)$; $(0.1 \leq Y \leq 1.2)$ and $(0.001 \leq Z \leq 0.1)$. Such a film according to the invention can be deposited, for example, with an apparatus like the one schematically represented in FIG. 1, and by means of the application of the method according to the invention, in that two Al targets 4 and 5 are reactively sputtered, for example, by means of a mixed pulse mode consisting of a unipolar pulse mode and a bipolar pulse mode, while the reactive gas oxygen is also introduced into the vacuum chamber 1 through the inlet 7 in addition to the inert gas and the reactive gas nitrogen. Already the smallest amounts of introduced oxygen cause the electric polarity of an AlN-containing piezoelectrically active film to be inversely configured with respect to an AlN-containing piezoelectrically active film that has no oxygen. Since the quality of the piezoelectric properties decreases as oxygen content in a film containing AlN increases, the amount of oxygen introduced into the vacuum chamber 1 should be adjusted in such a way that it corresponds to a maximum of 5% of the amount of the nitrogen introduced into the vacuum chamber 1. The range of applications of piezoelectrically active films containing AlN can thus be expanded by means of a film according to the invention, which has a reversed electric polarity.

In an alternative film according to the invention, the film containing AlN still also contains the element scandium, wherein this film containing AlN corresponds to the formula $Al_XSc_UN_YO_Z$. In this case, the variables X, U, Y, Z have the values: $(0.1 \leq X \leq 1.2)$; $(0.1 \leq U \leq 1.2)$; $(0.1 \leq Y \leq 1.2)$ and $(0.001 \leq Z \leq 0.1)$. The ratio of U/X>0.5, that is, in an exemplary embodiment, the scandium proportion is more than 50% with reference to the elements scandium and aluminum. Such a high scandium proportion in the film is likewise suited to reduce the mechanical stress in a film containing AlN. The deposition of the piezoelectrically active $Al_XSc_UN_YO_Z$ film is possible by means of the method according to the invention described above, wherein targets containing scandium and aluminum are sputtered in the mixed pulse mode, while an inert gas and a gas mixture of nitrogen and oxygen are introduced into the vacuum chamber 1. The targets used here can be either a pure aluminum target and a pure scandium target, two aluminum-scandium alloy targets, or targets with the aluminum-scandium tile structure described above.

The invention claimed is:

1. A method comprising depositing a piezoelectric film comprising AlN on a substrate by means of magnetron sputtering of at least two targets, of which at least one target comprises aluminum, within a vacuum chamber, wherein a gas mixture comprising at least reactive nitrogen gas and an inert gas is introduced into the vacuum chamber, wherein a unipolar pulse mode and a bipolar pulse mode are alternately used during magnetron sputtering.

2. The method according to claim 1, wherein the percentage of the phases of the unipolar pulse mode and the percentage of the phases of the bipolar pulse mode are modified during the deposition of the piezoelectric film comprising AlN.

3. The method according to claim 1, wherein a gas comprising at least one of the elements argon, krypton, or xenon is used as the inert gas.

4. The method according to claim 1, wherein a reactive gas oxygen is additionally introduced into the vacuum chamber, wherein the amount of introduced oxygen is a maximum of 5% of the amount of the introduced nitrogen.

5. The method according to claim 1, wherein at least one target that comprises scandium is used.

6. The method according to claim 5, wherein a scandium target and an aluminum target are sputtered by means of co-sputtering.

7. The method according to claim 1, wherein a change between the unipolar pulse mode and the bipolar pulse mode is carried out at a frequency in a range of 50 Hz to 10 kHz.

8. The method according to claim 1, wherein a pressure in the vacuum chamber is changed during the deposition of the piezoelectric film comprising AlN.

9. The method according to claim 1, wherein the piezoelectric film comprising AlN has a piezoelectric charge constant $d_{33}$, wherein the film comprising AlN further comprises the element oxygen, so that the piezoelectric film comprising AlN corresponds to the formula $Al_XN_YO_Z$, wherein $(0.1 \leq X \leq 1.2)$; $(0.1 \leq Y \leq 1.2)$ and $(0.001 \leq Z \leq 0.1)$.

10. The method according to claim 9, wherein said film further comprises the element scandium according to the formula $Al_XSc_UN_YO_Z$, wherein $(0.1 \leq X \leq 1.2)$; $(0.1 \leq U \leq 1.2)$; $(0.1 \leq Y \leq 1.2)$ and $(0.001 \leq Z \leq 0.1)$.

* * * * *